United States Patent
Hanajima et al.

(10) Patent No.: US 11,745,374 B2
(45) Date of Patent: Sep. 5, 2023

(54) CUTTING APPARATUS AND CUTTING METHOD

(71) Applicant: DISCO CORPORATION, Tokyo (JP)

(72) Inventors: Satoshi Hanajima, Tokyo (JP); Jun Nakama, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 212 days.

(21) Appl. No.: 17/144,318

(22) Filed: Jan. 8, 2021

(65) Prior Publication Data
US 2021/0229306 A1   Jul. 29, 2021

(30) Foreign Application Priority Data

Jan. 28, 2020 (JP) .................................. 2020-011765

(51) Int. Cl.
*B26D 1/14* (2006.01)
*H01L 21/66* (2006.01)
*H01L 21/78* (2006.01)
*H01L 21/67* (2006.01)

(52) U.S. Cl.
CPC ........ *B26D 1/141* (2013.01); *H01L 21/67092* (2013.01); *H01L 21/78* (2013.01); *H01L 22/12* (2013.01)

(58) Field of Classification Search
CPC ... B26D 1/141; H01L 21/67092; H01L 21/78; H01L 22/12
See application file for complete search history.

(56) References Cited

U.S. PATENT DOCUMENTS

| | | | |
|---|---|---|---|
| 2019/0389091 A1* | 12/2019 | Chen ................. | H01L 21/67028 |
| 2020/0058524 A1* | 2/2020 | Sekiya .............. | H01L 21/67253 |
| 2022/0219263 A1* | 7/2022 | Hadano ................ | B23K 26/402 |
| 2023/0005792 A1* | 1/2023 | Wakahara ........... | H01L 21/3065 |

FOREIGN PATENT DOCUMENTS

| | | |
|---|---|---|
| JP | 2010082644 A | 4/2010 |
| JP | 2010087141 A | 4/2010 |

* cited by examiner

*Primary Examiner* — Omar Flores Sanchez
(74) *Attorney, Agent, or Firm* — Greer Burns & Crain Ltd.

(57) ABSTRACT

A cutting apparatus includes a holding table that has at at least a part of a holding surface a transparent section including a transparent member and that holds a workpiece, a cutting unit including a cutting blade that cuts the workpiece held by the holding table, and a cutting water nozzle that supplies cutting water during cutting of the workpiece by the cutting blade, an imaging camera that images the workpiece through the transparent section, and a removing unit that removes a liquid adhered to the transparent section. The removing unit includes a contact member positioned at a contact position for making contact with the transparent section and a retracted position, and an X-axis moving unit that relatively moves on the transparent section the contact member making contact with the transparent section.

14 Claims, 15 Drawing Sheets

CUTTING APPARATUS AND CUTTING METHOD

BACKGROUND OF THE INVENTION

Field of the Invention

The present invention relates to a cutting apparatus and a cutting method.

Description of the Related Art

A processing apparatus for processing a workpiece such as a cutting apparatus may confirm cut grooves which are processing marks for, for example, performing alignment between processing means such as a cutting blade and the workpiece. As the processing apparatus, a processing apparatus in which a holding table for holding the workpiece is provided with a transparent section including a transparent member, for enabling the workpiece to be imaged from below, may be used (see, for example, Japanese Patent Laid-open No. 2010-87141 and Japanese Patent Laid-open No. 2010-82644).

SUMMARY OF THE INVENTION

The aforementioned cutting apparatus has a problem that cutting water supplied during cutting may adhere onto the holding table by, for example, dropping from the workpiece when the workpiece is carried out. When a liquid is adhering to the transparent section, water drops would come out in an image of the workpiece obtained by imaging through the transparent section, and the pattern of the workpiece, cut grooves, and the like cannot be accurately detected from the picked-up image at the time of alignment or kerf check. Therefore, an improvement is desired. Thus, the aforementioned cutting apparatus has a problem that the detected state of the workpiece imaged through the transparent section would be worsened.

Accordingly, it is an object of the present invention to provide a cutting apparatus and a cutting method by which the detected state of a workpiece imaged through a transparent section can be restrained from being worsened.

In accordance with an aspect of the present invention, there is provided a cutting apparatus including a holding table that has at at least a part of a holding surface a transparent section including a transparent member and that holds a workpiece, a cutting unit including a cutting blade that cuts the workpiece held by the holding table, and a cutting water nozzle that supplies cutting water during cutting of the workpiece by the cutting blade, an imaging camera that images the workpiece through the transparent section, and a removing unit that removes a liquid adhered to the transparent section.

Preferably, the removing unit includes a contact member that is positioned at a contact position for making contact with the transparent section and a retracted position, and a moving mechanism that relatively moves on the transparent section the contact member making contact with the transparent section.

Preferably, the removing unit includes a jetting section that jets air toward the transparent section, and a moving mechanism that moves the jetting section on the transparent section.

In accordance with another aspect of the present invention, there is provided a cutting method for processing a workpiece by the cutting apparatus, the cutting apparatus including a holding table that has at at least a part of a holding surface a transparent section including a transparent member and that holds the workpiece, a cutting unit including a cutting blade that cuts the workpiece held by the holding table, and a cutting water nozzle that supplies cutting water during cutting of the workpiece by the cutting blade, an imaging camera that images the workpiece through the transparent section, and a removing unit that removes a liquid adhered to the transparent section. The cutting method includes a removing step of removing the liquid on the transparent section by the removing unit, a holding step of holding the workpiece by the holding table, after the removing step is carried out, an imaging step of imaging the workpiece by the imaging camera through the transparent section, after the holding step is carried out, and a cutting step of cutting the workpiece held by the holding table by the cutting blade.

The present invention exhibits an effect that the detected state of a workpiece imaged through the transparent section can be restrained from being worsened.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 4 is a perspective view depicting a contact member of the removing unit illustrated in FIG. 3, and the like;

FIG. 5 is a side view depicting the contact member of the removing unit illustrated in FIG. 4, and the like;

FIG. 14 is a perspective view depicting a contact member of a removing unit of a cutting apparatus according to a second embodiment, and the like;

DETAILED DESCRIPTION OF THE PREFERRED EMBODIMENTS

Figure 1:
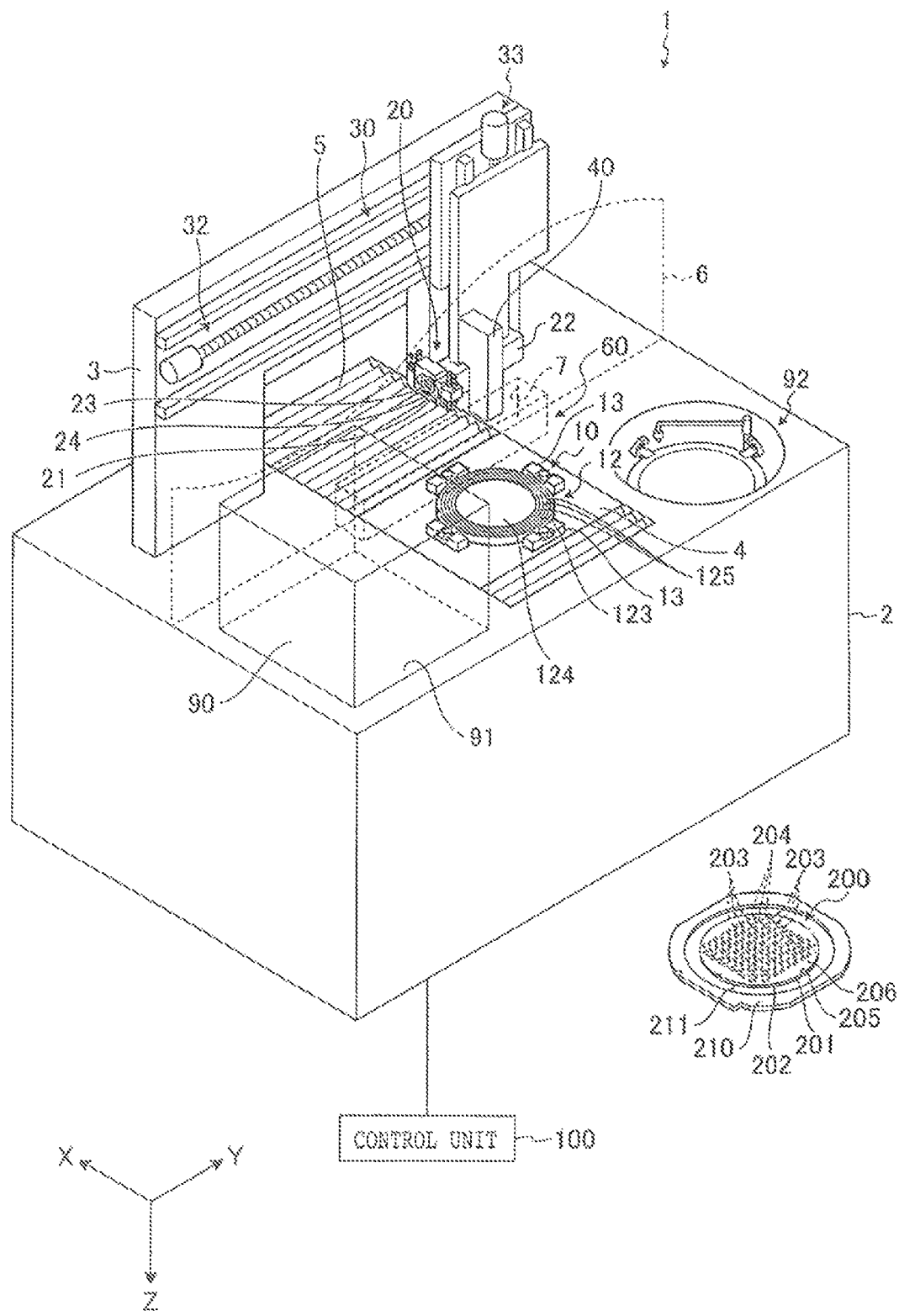
FIG. 1 is a perspective view depicting a configuration example of a cutting apparatus according to a first embodiment.

Embodiments of the present invention will be described in detail below referring to the drawings. The present invention is not limited by the contents described in the following embodiments. In addition, the following components include those which can be easily conceived by a person skilled in the art, and those which are substantially the same. Further, the following configurations can be combined with each other, as required. Besides, various kinds of omission, replacement, or modification of the configuration are possible within such ranges as not to depart from the gist of the present invention.

First Embodiment

Figure 2:
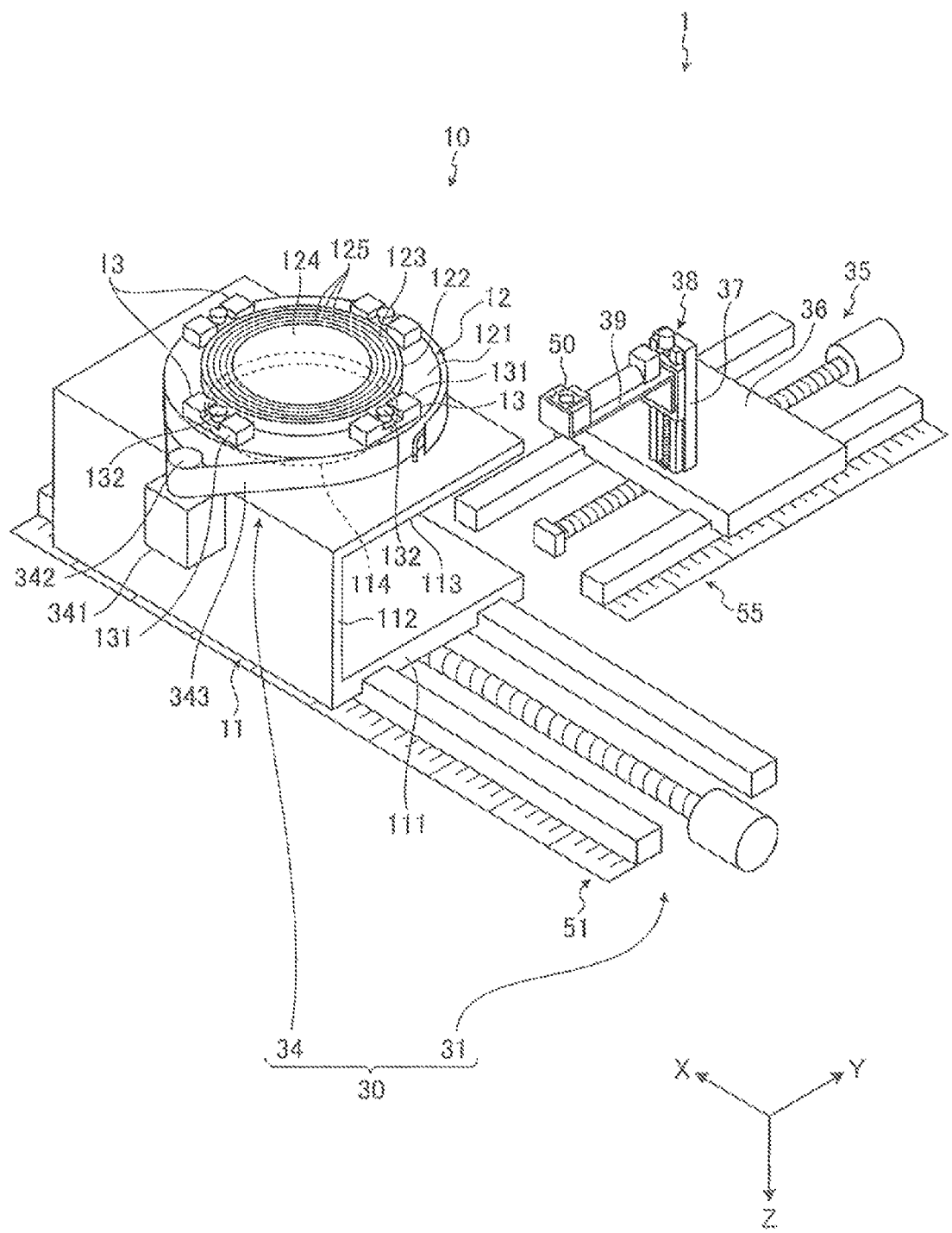
FIG. 2 is a perspective view depicting a holding unit and an imaging camera of the cutting apparatus illustrated in FIG. 1.
Figure 3:
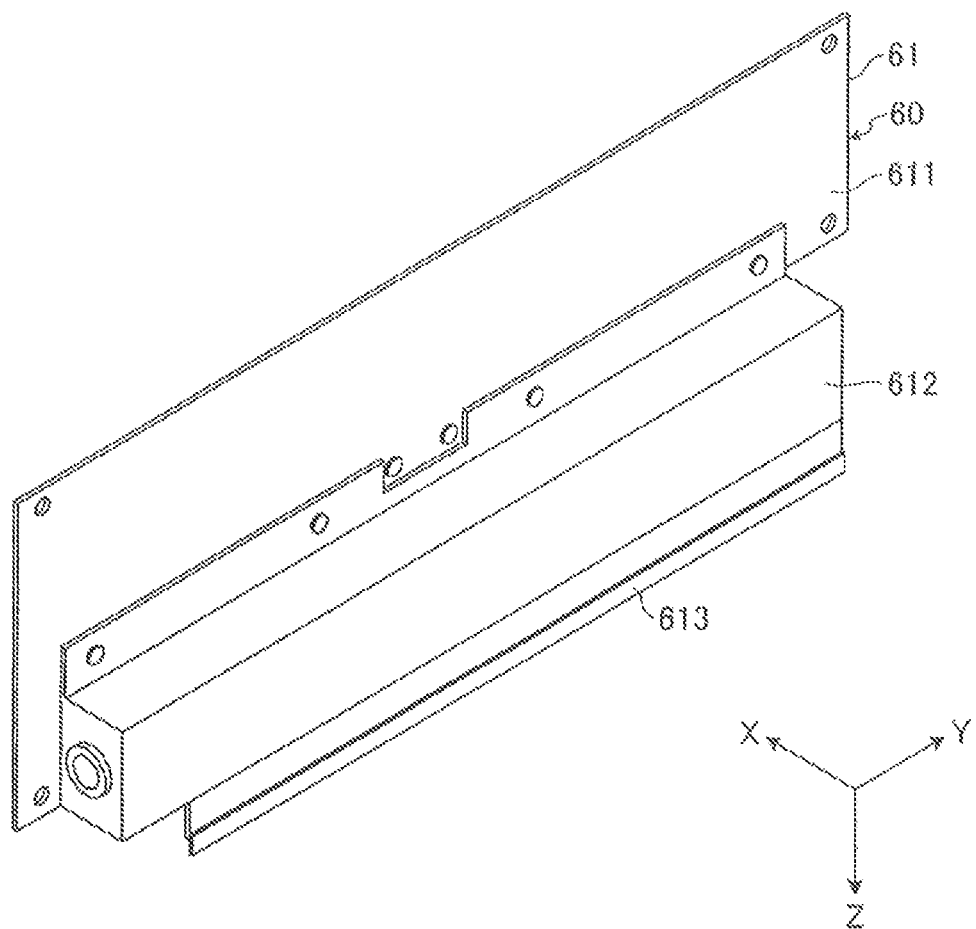
FIG. 3 is a perspective view of a removing unit of the cutting apparatus illustrated in FIG. 1.
Figure 4:
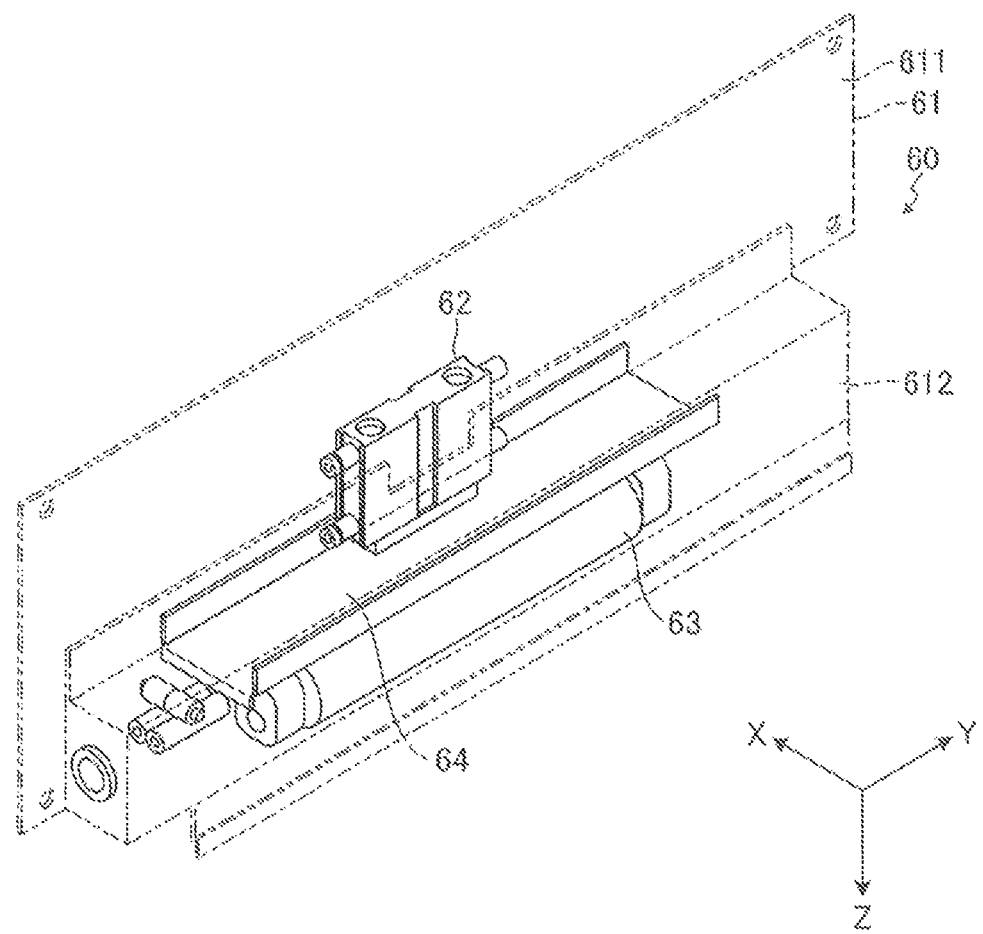
Figure 5:
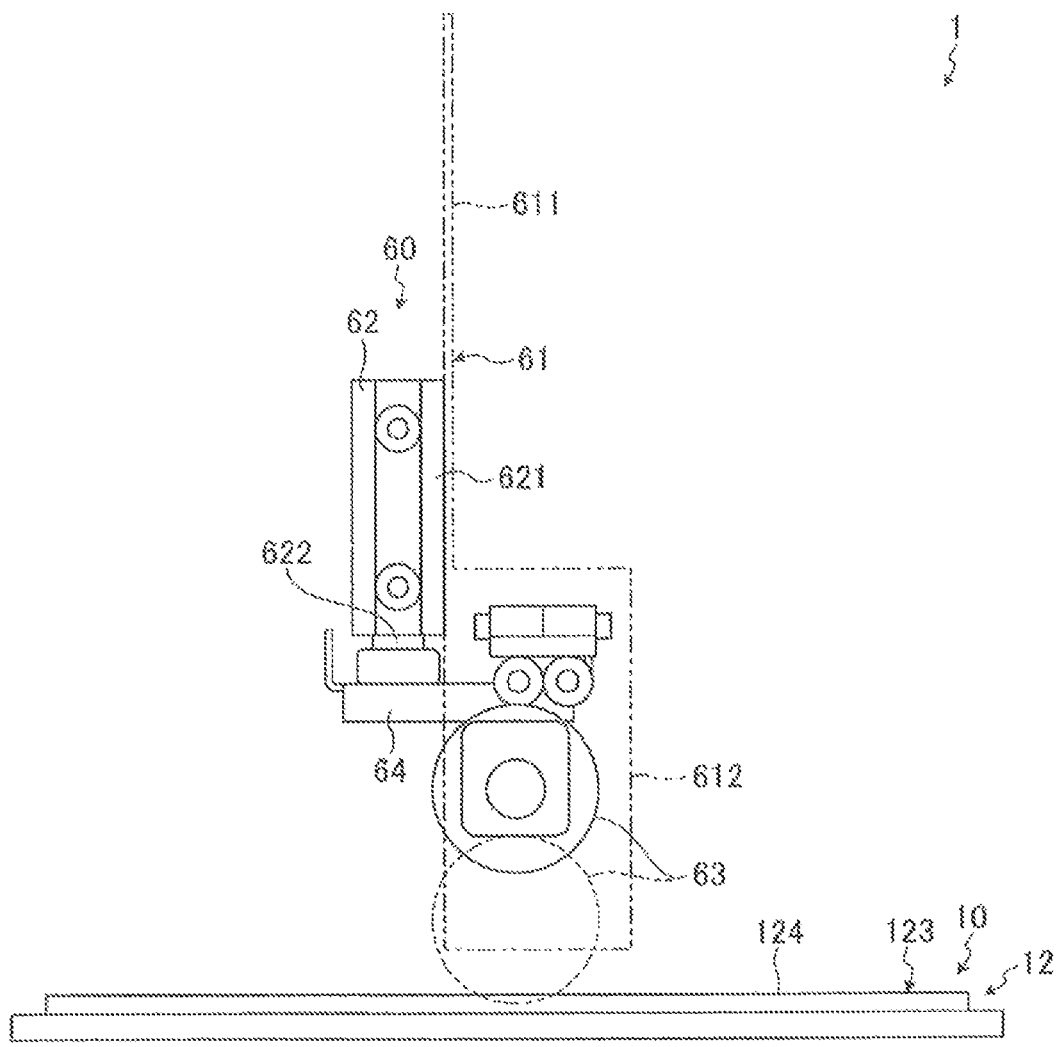

A cutting apparatus according to a first embodiment of the present invention will be described based on the drawings. FIG. 1 is a perspective view depicting a configuration example of the cutting apparatus according to the first embodiment. FIG. 2 is a perspective view depicting a holding unit and an imaging camera of the cutting apparatus illustrated in FIG. 1. FIG. 3 is a perspective view of a removing unit of the cutting apparatus illustrated in FIG. 1. FIG. 4 is a perspective view depicting a contact member of the removing unit illustrated in FIG. 3, and the like. FIG. 5 is a side view depicting the contact member of the removing unit illustrated in FIG. 4, and the like.

A cutting apparatus 1 according to the first embodiment is a processing apparatus for cutting (corresponding to processing) a workpiece 200. The workpiece 200 as an object of processing by the cutting apparatus 1 depicted in FIG. 1 is a wafer such as a disk-shaped semiconductor wafer or optical device wafer including a substrate 201 of silicon, sapphire, gallium arsenide, silicon carbide (SiC), or the like. The workpiece 200 is formed with devices 204 in regions partitioned in a grid pattern by a plurality of streets 203 on a front surface 202 of the substrate 201.

The device 204 is an integrated circuit such as an integrated circuit (IC) or large scale integration (LSI) or an image sensor such as a charge coupled device (CCD) and a complementary metal oxide semiconductor (CMOS). In the first embodiment, the workpiece 200 has a metallic film 206 formed on a back surface 205 on the back side of the front surface 202 of the substrate 201. Since the workpiece 200 is formed with the metallic film 206 on the back surface 205, the streets 203 cannot be detected even when imaging is conducted by an infrared camera from the back surface 205 side.

In the first embodiment, the front surface 202 of the workpiece 200 is adhered to a tape 211 with an annular frame 210 mounted to an outer peripheral edge thereof, to be thereby supported by the annular frame 210, and the metallic film 206 on the back surface 205 side is directed to the upper side. Note that, while the metallic film 206 is formed on the back surface 205 of the substrate 201 in the first embodiment, in the present invention the metallic film 206 may not be formed, and the back surface 205 may be adhered to the tape 211 and the front surface 202 side may be directed to the upper side.

The cutting apparatus 1 illustrated in FIG. 1 is a processing apparatus for holding the workpiece 200 by a holding table 12 of a holding unit 10 and cutting the workpiece 200 along the streets 203 by a cutting blade 21, to divide the workpiece 200 into individual devices 204. As illustrated in FIG. 1, the cutting apparatus 1 includes the holding unit 10, a cutting unit 20, a moving unit 30, an upper camera 40, and a control unit 100.

As depicted in FIG. 2, the holding unit 10 includes a housing 11 moved in an X-axis direction parallel to a horizontal direction by an X-axis moving unit 31 of the moving unit 30, the holding table 12 provided on the housing 11 such as to be rotatable around an axis parallel to a Z-axis direction along the vertical direction, and a plurality of frame fixing sections 13 provided in the periphery of a holding surface 124 of the holding table 12.

In the first embodiment, the housing 11 includes a lower plate 111 moved in the X-axis direction by the X-axis moving unit 31 and parallel to a horizontal direction, a side plate 112 erected from an outer edge of the lower plate 111, and an upper plate 113 connected having an outer edge continuous with an upper edge of the side plate 112 and being parallel to the lower plate 111.

The holding table 12 holds the workpiece 200 on the holding surface 124 and is supported by the upper plate 113 such as to be rotatable around an axis. The holding table 12 has an annular support member 121 supported by the upper plate 113 such as to be rotatable around an axis parallel to the Z-axis direction, an annular frame body 122 provided on the support member 121, and a disk-shaped transparent section 123 fitted to the inside of the frame body 122. The holding table 12 is disposed at such a position that the support member 121, the frame body 122, and the transparent section 123 are coaxial with one another.

The transparent section 123 includes a transparent member of quartz glass, borosilicate glass, sapphire, calcium fluoride, lithium fluoride, magnesium fluoride, or the like, and its upper surface is the holding surface 124 for holding the workpiece 200. The holding surface 124 is formed with a plurality of suction grooves 125, and, in the first embodiment, the plurality of suction grooves 125 are formed in the shape of circles different in diameter and disposed concentrically at an outer edge portion of the holding surface 124. The front surface 202 side of the workpiece 200 is mounted on the holding surface 124 of the holding table 12 through the tape 211. In the first embodiment, the holding table 12 has the transparent section 123 including the transparent member at the whole part of the holding surface 124, but, in the present invention, the transparent section 123 including the transparent member may be provided at at least a part of the holding surface 124.

The frame fixing section 13 includes a frame support section 131 that is disposed at an outer edge portion of the support member 121 and has the annular frame 210 mounted on an upper surface thereof, and a vacuum pad 132 that suction holds the annular frame 210 mounted on the upper surface of the frame support section 131.

The holding table 12 has the suction grooves 125 and the vacuum pad 132 connected to a vacuum suction source (not illustrated), and, by being sucked by the vacuum suction source, suction holds the workpiece 200 mounted on the holding surface 124, and suction holds the annular frame 210 mounted on the upper surface of the frame support section 131 on the frame fixing sections 13. In the first embodiment, the holding table 12 suction holds the front surface 202 side of the workpiece 200 on the holding surface 124 through the tape 211, and suction holds the annular frame 210 on the frame fixing sections 13 through the tape 211. In addition, in the first embodiment, the holding unit 10 is provided with a circular through-hole 114 in the upper plate 113 of the housing 11. The through-hole 114 is disposed at such a position as to be coaxial with the support member 121, the frame body 122, and the transparent section 123 of the holding table 12.

The moving unit 30 includes the X-axis moving unit 31 which is a processing feeding unit depicted in FIG. 2, a Y-axis moving unit 32 which is an indexing feeding unit depicted in FIG. 1, a Z-axis moving unit 33 which is a cutting-in feeding unit depicted in FIG. 1, and a rotational moving unit 34 that rotates the holding table 12 around an axis parallel to the Z-axis direction and is depicted in FIG. 2.

The X-axis moving unit 31 moves the lower plate 111 of the housing 11 of the holding unit 10 in the X-axis direction, thereby relatively moving the holding table 12 and the cutting unit 20 in the X-axis direction. The X-axis moving unit 31 moves the holding table 12 in the X-axis direction ranging over a carrying-in/out region 4 where the workpiece 200 is carried onto and out of the holding table 12, and a processing region 5 where the workpiece 200 held by the holding table 12 is cut. The Y-axis moving unit 32 moves the cutting unit 20 in the Y-axis direction parallel to a horizontal direction and orthogonal to the X-axis direction, thereby relatively moving the holding table 12 and the cutting unit 20 in the Y-axis direction. The Z-axis moving unit 33 moves the cutting unit 20 in the Z-axis direction, thereby relatively moving the holding table 12 and the cutting unit 20 in the Z-axis direction.

The X-axis moving unit 31, the Y-axis moving unit 32, and the Z-axis moving unit 33 each include a known ball screw provided to be rotatable around an axis, a known motor that rotates the ball screw around the axis and known guide rails that support the holding table 12 or the cutting unit 20 movably in the X-axis direction, the Y-axis direction, or the Z-axis direction.

The rotational moving unit 34 rotates the holding table 12 around an axis parallel to the Z-axis direction. The rotational moving unit 34 rotates the holding table 12 around the axis by an angle in a range of more than 180 degrees and less than 360 degrees. The rotational moving unit 34 includes a motor 341 fixed to the side plate 112 of the housing 11, a pulley 342 connected to an output shaft of the motor 341, and a belt 343 wound around the outer periphery of the support member 121 of the holding table 12 and rotated around an axis by the pulley 342. When the motor 341 is rotated, the rotational moving unit 34 rotates the holding table 12 around the axis through the pulley 342 and the belt 343. In addition, in the first embodiment, the rotational moving unit 34 can rotate the holding table 12 by 220 degrees both in one direction around the axis and in the other direction reverse to the one direction.

The cutting unit 20 is a processing unit that cuts the workpiece 200 held by the holding table 12 by the cutting blade 21. The cutting unit 20 is provided to be movable in the Y-axis direction by the Y-axis moving unit 32 relative to the workpiece 200 held by the holding table 12, and to be movable in the Z-axis direction by the Z-axis moving unit 33. The cutting unit 20 is provided on the support frame 3 erected from an apparatus main body 2 through the Y-axis moving unit 32, the Z-axis moving unit 33, and the like.

The cutting unit 20 can position the cutting blade 21 at any position of the holding surface 124 of the holding table 12 by the Y-axis moving unit 32 and the Z-axis moving unit 33. The cutting unit 20 includes the cutting blade 21, a spindle housing 22 provided to be movable in the Y-axis direction and the Z-axis direction by the Y-axis moving unit 32 and the Z-axis moving unit 33, a spindle 23 which is provided in the spindle housing 22 such as to be rotatable around an axis, which is rotated by a motor and which has the cutting blade 21 mounted to a tip end thereof, and a cutting water nozzle 24.

The cutting blade 21 is for cutting the workpiece 200 held by the holding table 12 and is an extremely thin cutting grindstone having a substantially ring-like shape. In the first embodiment, the cutting blade 21 is a so-called hub blade including an annular circular base, and an annular cutting edge that is disposed at an outer peripheral edge of the circular base and cuts the workpiece 200. The cutting edge includes abrasive grains of diamond, cubic boron nitride (CBN), or the like and a bond material (binder) such as a metal or a resin and is formed in a predetermined thickness. Note that, in the present invention, the cutting blade 21 may be a so-called washer blade including only a cutting edge.

The spindle 23 rotates the cutting blade 21 around an axis, by being rotated around an axis by the motor. Note that the axes of the cutting blade 21 and the spindle 23 of the cutting unit 20 are parallel to the Y-axis direction. The cutting water nozzle 24 is provided at a tip end of the spindle housing 22, and supplies cutting water to the workpiece 200 and the cutting blade 21 during cutting of the workpiece 200 by the cutting blade 21.

The upper camera 40 is fixed to the cutting unit 20 such as to be moved as one body with the cutting unit 20. The upper camera 40 includes an imaging element that images the workpiece 200 held by the holding table 12 from above. The imaging element is, for example, a CCD imaging element or a CMOS imaging element. The upper camera 40 images the workpiece 200 held by the holding table 12, and outputs the thus obtained image to the control unit 100.

In addition, as illustrated in FIG. 2, the cutting apparatus 1 includes an imaging camera 50 that images the workpiece 200 through the transparent section 123. The imaging camera 50 images the workpiece 200 held by the holding table 12 from below the workpiece 200 through the transparent section 123.

In the first embodiment, the imaging camera 50 is disposed adjacent to the holding unit 10 in the Y-axis direction. In addition, the imaging camera 50 is disposed to be movable in the Y-axis direction by a second Y-axis moving unit 35 provided on the apparatus main body 2 and is disposed to be movable in the Z-axis direction by a second Z-axis moving unit 38 provided on an erect column 37 erected from a moving plate 36 moved in the Y-axis direction by the second Y-axis moving unit 35. In the first embodiment, the imaging camera 50 is attached to the other end of a horizontal extension member 39 having one end attached to a lifting member movable in the Z-axis direction by the second Z-axis moving unit 38.

The second Y-axis moving unit 35 and the second Z-axis moving unit 38 each include a known ball screw provided to be rotatable around an axis, a known motor that rotates the ball screw around an axis, and known guide rails that support the moving plate or the imaging camera 50 movably in the Y-axis direction or the Z-axis direction.

The imaging camera 50 includes an imaging element that images the workpiece 200 held by the holding table 12 from below through the transparent section 123. The imaging element is, for example, a CCD imaging element or a CMOS imaging element. The imaging camera 50 images the workpiece 200 held by the holding table 12, and outputs the thus obtained image to the control unit 100.

In addition, the cutting apparatus 1 includes an X-axis direction position detection unit 51 (depicted in FIG. 2) for detecting the position of the holding table 12 in the X-axis direction, a Y-axis direction position detection unit (not illustrated) for detecting the position of the cutting unit 20 in the Y-axis direction, and a Z-axis direction position detection unit for detecting the position of the cutting unit 20 in the Z-axis direction. The X-axis direction position detection unit 51 and the Y-axis direction position detection unit can each include a linear scale parallel to the X-axis direction or the Y-axis direction, and a reading head. The Z-axis direction position detection unit detects the position of the cutting unit 20 in the Z-axis direction by pulses of a motor. The X-axis direction position detection unit 51, the Y-axis direction position detection unit, and the Z-axis direction position detection unit output the position of the holding table 12 in the X-axis direction and the position of the cutting unit 20 in the Y-axis direction or the Z-axis direction to the control unit 100.

Besides, the cutting apparatus 1 includes a second Y-axis direction position detection unit 55 (depicted in FIG. 2) for detecting the position of the imaging camera 50 in the Y-axis direction. The second Y-axis direction position detection unit 55 can include a linear scale parallel to the Y-axis direction, and a reading unit. The second Y-axis direction position detection unit 55 outputs the position of the imaging camera 50 in the X-axis direction and the position of the cutting unit 20 in the Y-axis direction or the Z-axis direction to the control unit 100. Note that the positions of the holding table 12, the cutting unit 20, and the imaging camera in each axis direction detected by each of the position detection units 51 and 55 are determined with predetermined reference positions of the cutting apparatus 1 as references.

In addition, the cutting apparatus 1 includes a cassette elevator 91 on which a cassette 90 accommodating a plurality of workpieces 200 before and after cutting is mounted and which moves the cassette 90 in the Z-axis direction, a cleaning unit 92 that cleans the workpiece 200 after cutting, and a carrying unit (not illustrated) which carries the workpiece 200 into and out of the cassette 90 and carries the workpiece 200.

The control unit 100 controls each of the aforementioned components of the cutting apparatus 1, to cause the cutting apparatus 1 to perform a processing operation on the workpiece 200. Note that the control unit 100 is a computer including an arithmetic processing device having a microprocessor such as a central processing unit (CPU), a storage device having a memory such as a read only memory (ROM) or a random access memory (RAM), and an input-output interface device. The arithmetic processing device of the control unit 100 executes an arithmetic processing according to a computer program stored in the storage device, and outputs control signals for controlling the cutting apparatus 1 to the aforementioned components of the cutting apparatus 1 through the input-output interface device.

In addition, the cutting apparatus 1 is connected to a display unit (not illustrated) including, for example, a liquid crystal display connected to the control unit 100 and displaying the state of a processing operation, images, and the like, and an input unit connected to the control unit 100 and used when the operator registers processing contents information and the like. In the first embodiment, the input unit includes at least one of a touch panel provided on the display unit and an external input device such as a keyboard.

Besides, the cutting apparatus 1 includes an exterior cover (not illustrated) covering the upper side of the apparatus main body 2, namely, covering the holding unit 10, the cutting unit 20, the cleaning unit 92, and the carrying unit, and a partition wall 6 by which the space inside the exterior cover is partitioned into the carrying-in/out region 4 and the processing region 5. The partition wall 6 is provided inside the exterior cover. The partition wall 6 is provided at a lower end portion thereof with a table inlet-outlet 7 that permits the holding table 12 to be moved ranging over the carrying-in/out region 4 and the processing region 5.

In addition, the cutting apparatus 1 includes a removing unit 60. The removing unit 60 is for removing a liquid adhered to the transparent section 123 of the holding table 12. As illustrated in FIGS. 3, 4, and 5, the removing unit 60 includes a unit main body 61. The unit main body 61 includes a flat plate-shaped flat plate section 611 fixed to the partition wall 6 in the state of closing an upper end portion of the table inlet-outlet 7, and a box-shaped section 612 that is attached to the flat plate section 611 and is opened on the lower side. Besides, in the first embodiment, a rubber sheet 613 for preventing cutting water from entering into a lower end portion of the box-shaped section 612 is attached to the unit main body 61.

In addition, as depicted in FIGS. 4 and 5, the removing unit 60 includes a lifting mechanism 62 and a contact member 63. The contact member 63 is supported on a lower side of a support plate 64 accommodated in the box-shaped section 612 and provided in the box-shaped section 612 such as to be movable in the Z-axis direction. The contact member 63 includes a porous synthetic resin formed with numerous fine holes in the inside thereof, or sponge, and, in the embodiment, is formed in a cylindrical shape. The contact member 63 is supported on the support plate 64 such as to be rotatable around an axis parallel to the Y-axis direction, and its overall length is longer than the outside diameter of the transparent section 123.

The lifting mechanism 62 is for lifting the contact member 63 upward and downward in the Z-axis direction. In the first embodiment, the lifting mechanism 62 is a so-called air cylinder including a cylinder 621 fixed to the unit main body 61, and an extension-contraction rod 622 which is provided such as to be contractable and extendable from the cylinder 621 and has a tip end attached to the support plate 64. When the extension-contraction rod 622 of the lifting mechanism 62 is extended, the contact member 63 is positioned at a contact position for making contact with the holding surface 124 of the transparent section 123 of the holding table 12 passing through the table inlet-outlet 7, as indicated by a dotted line in FIG. 5, and, when the extension-contraction rod 622 is contracted, the contact member 63 is positioned at a retracted position of being located above the holding surface 124 of the transparent section 123 of the holding table 12 passing through the inside of the table inlet-outlet 7 and being retracted from the holding surface 124, as indicated by a solid line in FIG. 5. Therefore, in the first embodiment, the contact member 63 is positioned at the contact position and the retracted position.

Besides, the removing unit 60 includes the X-axis moving unit 31 of the moving unit 30. The X-axis moving unit 31 is a moving mechanism that relatively moves on the transparent section 123 the contact member positioned at the contact position and making contact with the holding surface 124 of the transparent section 123, by moving the holding table 12 in the X-axis direction.

Figure 6:
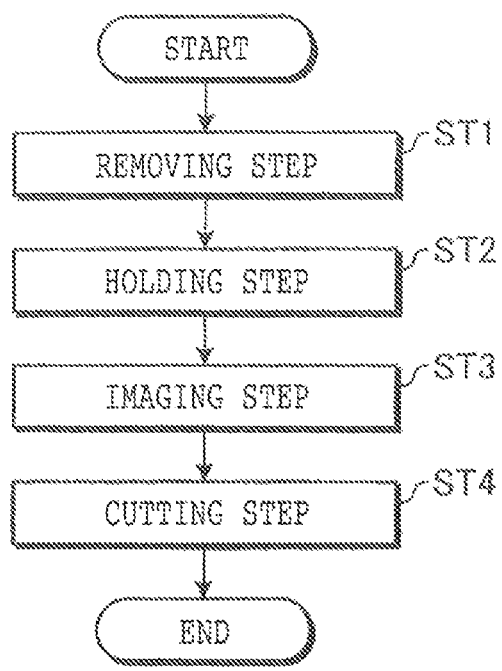
FIG. 6 is a flow chart depicting the flow of a cutting method according to the first embodiment.

Next, the cutting method according to the first embodiment will be described based on the drawings. FIG. 6 is a flow chart depicting the flow of the cutting method according to the first embodiment. The cutting method according to the first embodiment is a method of cutting one sheet of the workpiece 200 by the aforementioned cutting apparatus 1 and is a processing operation of the cutting apparatus 1. First, the operator registers the processing contents information in the control unit 100 and places the cassette 90 accommodating a plurality of workpieces 200 before cutting on the cassette elevator 91. Thereafter, when the control unit 100 accepts an instruction to start a processing operation from the operator, the cutting apparatus 1 starts the cutting method according to the first embodiment. As depicted in FIG. 6, the cutting method according to the first embodiment includes a removing step ST1, a holding step ST2, an imaging step ST3, and a cutting step ST4.

(Removing Step)

Figure 7:
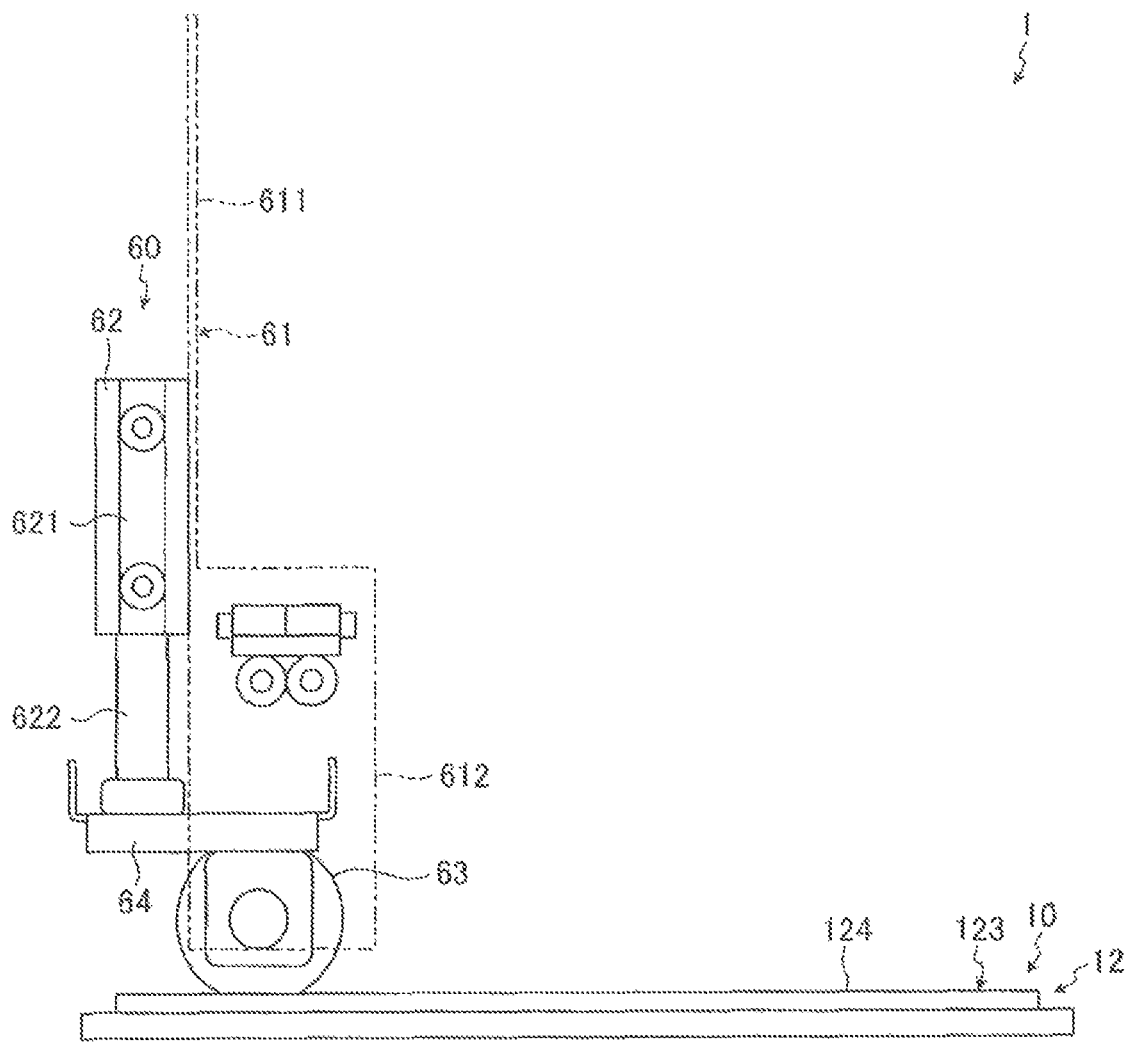
FIG. 7 is a side view depicting a state in which a contact member is put in contact with an end portion in an X-axis direction of a holding surface of a holding table, in a removing step of the cutting method depicted in FIG. 6.
Figure 8:
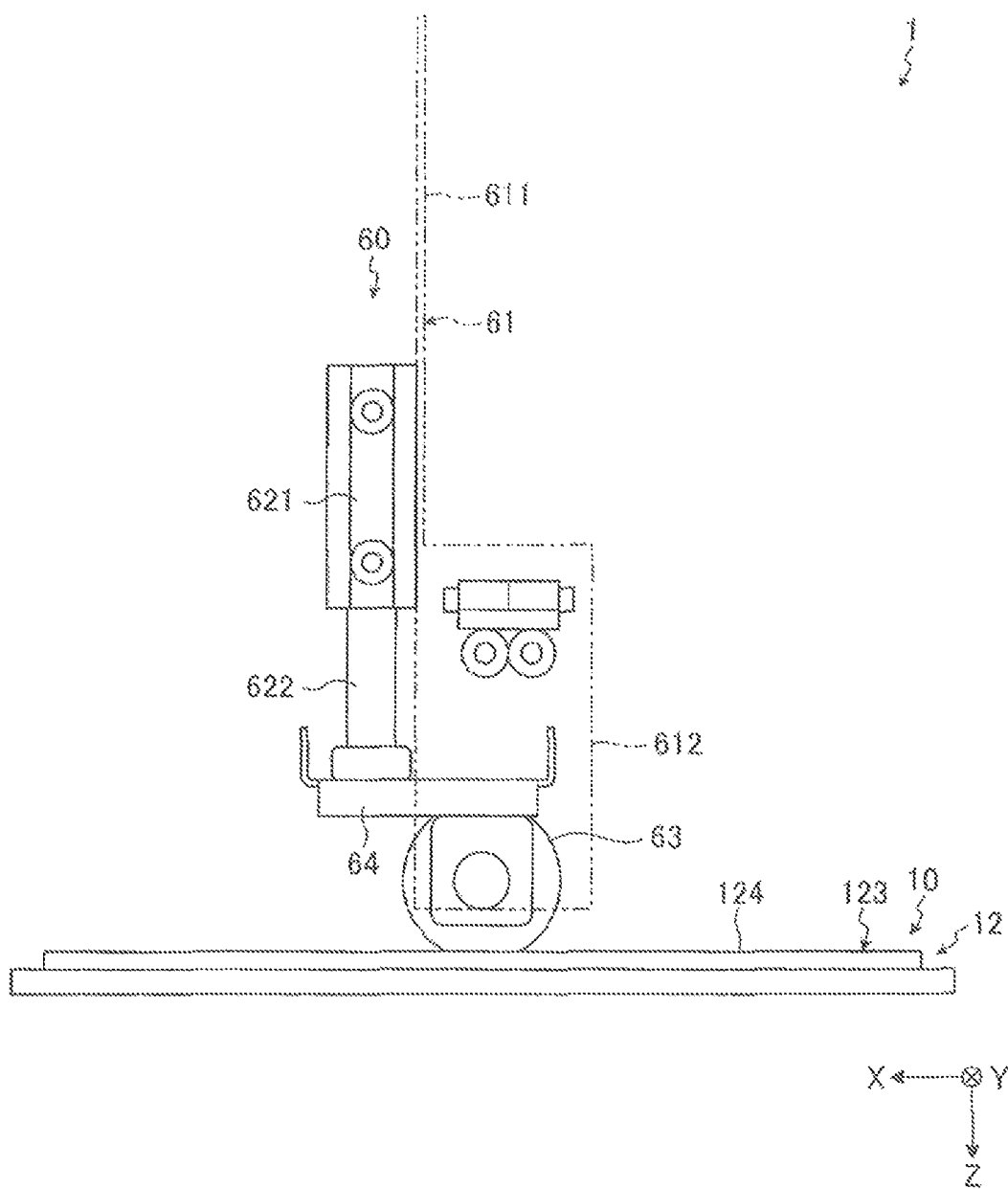
FIG. 8 is a side view depicting a state in which the contact member is put in contact with a central portion in the X-axis direction of the holding surface of the holding table, in the removing step of the cutting method depicted in FIG. 6.
Figure 9:
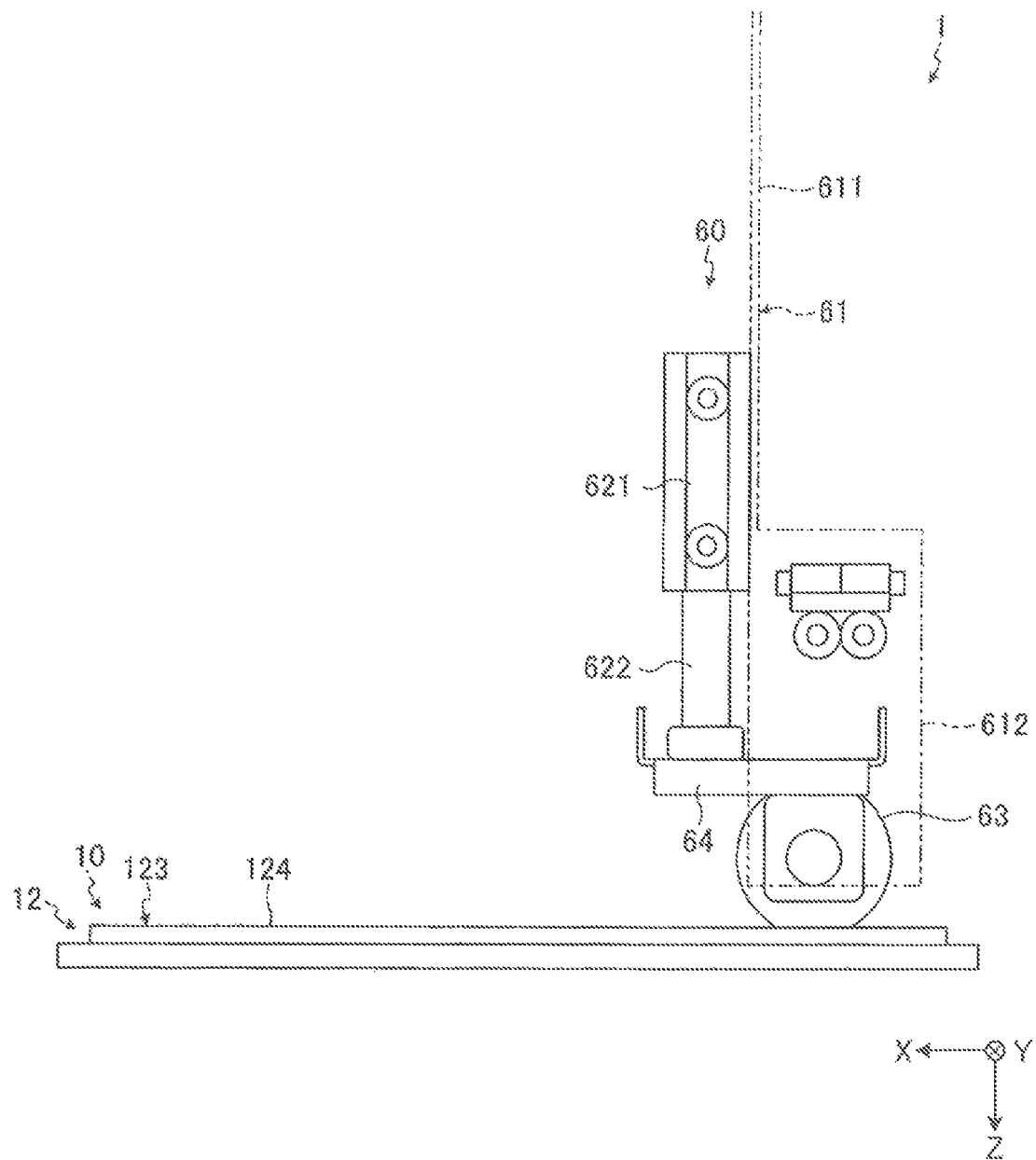
FIG. 9 is a side view depicting a state in which the contact member is put in contact with the other end portion in the X-axis direction of the holding surface of the holding table, in the removing step of the cutting method depicted in FIG. 6.

FIG. 7 is a side view depicting a state in which the contact member is put in contact with one end portion in the X-axis direction of the holding surface of the holding table, in the removing step of the cutting method depicted in FIG. 6. FIG. 8 is a side view depicting a state in which the contact member is put in contact with a central portion in the X-axis direction of the holding surface of the holding table, in the removing step of the cutting method depicted in FIG. 6. FIG. 9 is a side view depicting a state in which the contact member is put in contact with the other end portion in the X-axis direction of the holding surface of the holding table, in the removing step of the cutting method depicted in FIG. 6.

The removing step ST1 is a step of removing a liquid on the holding surface 124 of the transparent section 123 of the holding table 12 by the removing unit 60. In the first embodiment, in the removing step ST1, the control unit 100 of the cutting apparatus 1 controls the X-axis moving unit 31 to position the holding table 12 in the carrying-in/out region 4, and thereafter, controls the lifting mechanism 62 to lower the contact member 63 and to position the contact member 63 at the contact position. In the removing step ST1, the control unit 100 of the cutting apparatus 1 controls the X-axis moving unit 31 to move the holding table 12 toward the processing region 5. Then, as depicted in FIGS. 7, 8, and 9, the contact member 63 sequentially makes contact with the one end portion, the central portion, and the other end portion in the X-axis direction of the holding table 12, and the contact member 63 rolls on the holding surface 124 attendantly on a movement of the holding table 12, to remove the liquid adhered to the holding surface 124.

In the first embodiment, in the removing step ST1, the control unit 100 of the cutting apparatus 1 moves the holding table 12 from the carrying-in/out region 4 toward the processing region 5, thereafter controls the lifting mechanism 62 to raise the contact member 63 and to position the contact member 63 at the retracted position, controls the X-axis moving unit 31 to move the holding table 12 to the carrying-in/out region 4, and proceeds to the holding step ST2. Note that, in the present invention, in the removing step ST1, the control unit 100 of the cutting apparatus 1 may control the X-axis moving unit 31 to move the holding table 12 between the carrying-in/out region and the processing region a predetermined number of times, in a state in which the contact member 63 is positioned in the contact position, then may position the contact member 63 in the retracted position and move the holding table 12 to the carrying-in/out region 4, and to proceed the holding step ST2.

(Holding Step)

Figure 10:
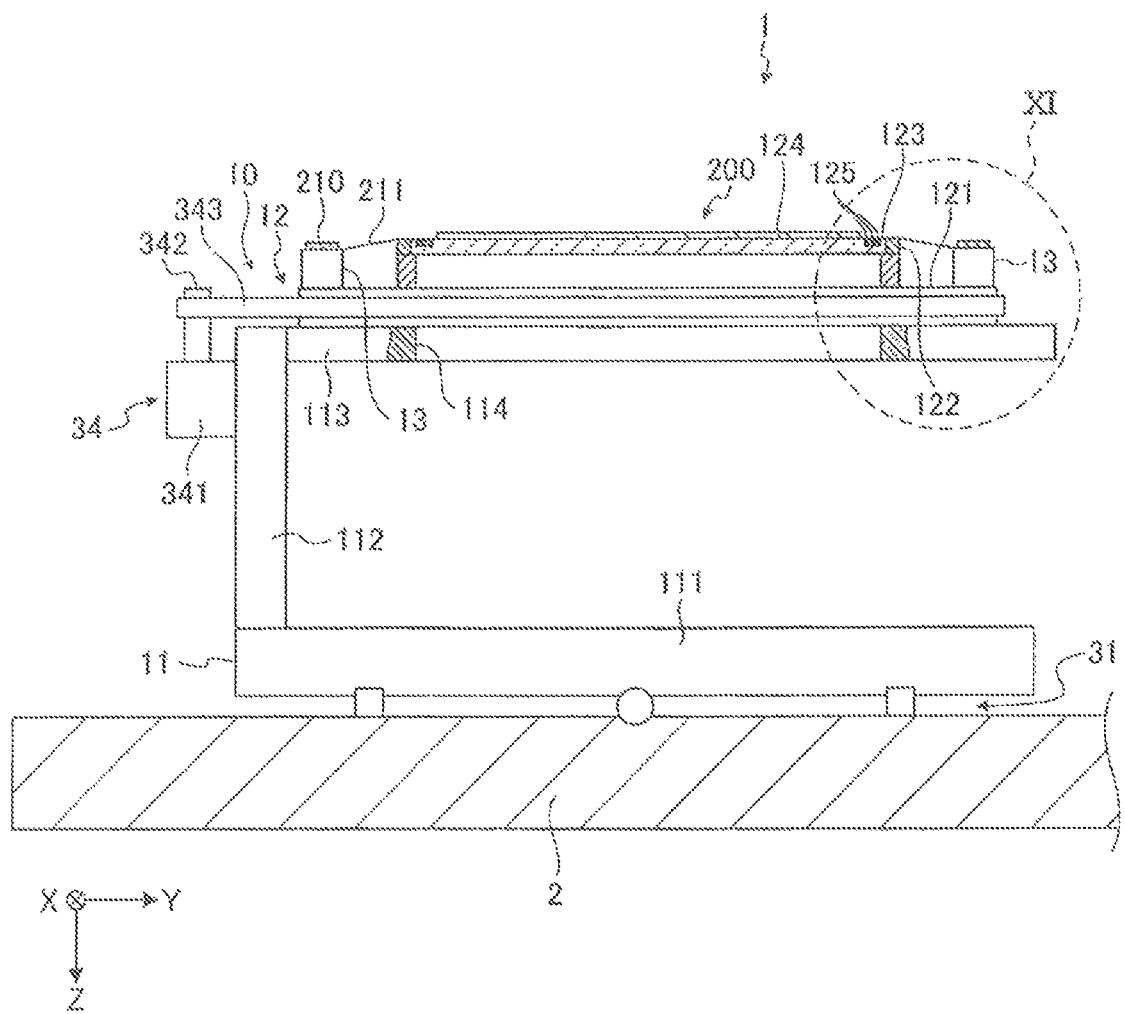
FIG. 10 is a side view depicting, partly in section, a holding step of the cutting method depicted in FIG. 6.
Figure 11:
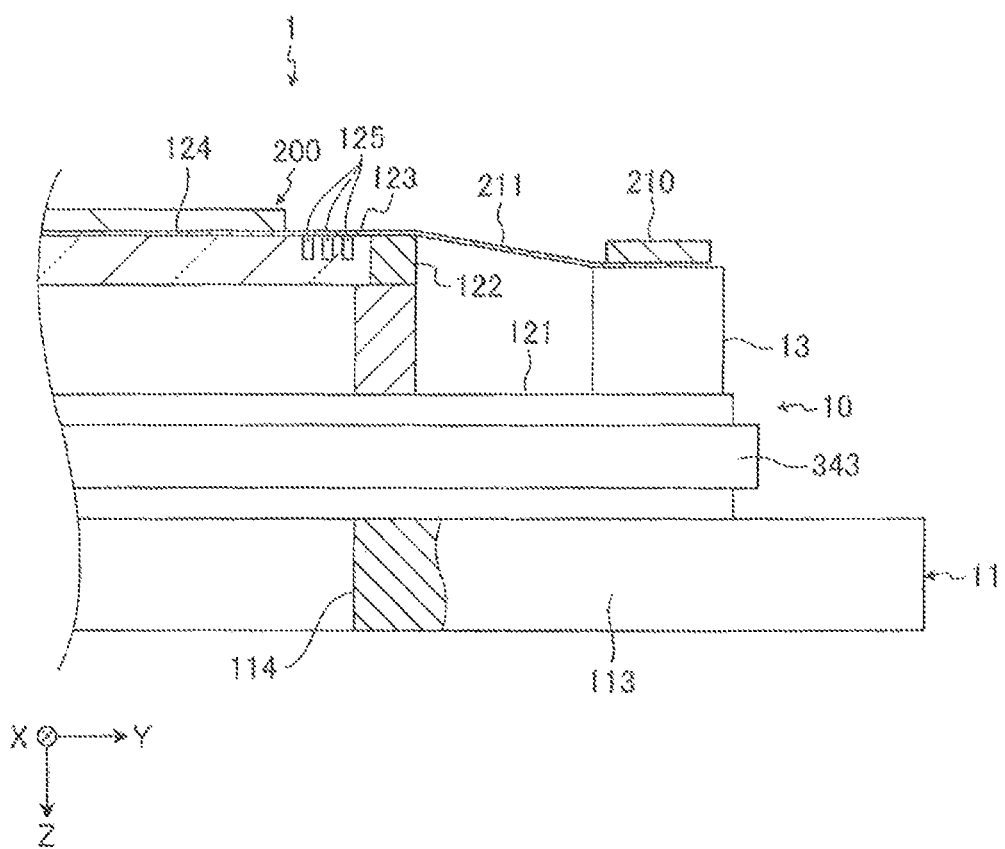
FIG. 11 is a side view depicting, in an enlarged form and partly in section, an XI part of FIG. 10.

FIG. 10 is a side view depicting, partly in section, the holding step of the cutting method depicted in FIG. 6. FIG. 11 is a side view depicting, in an enlarged form and partly in section, an XI part of FIG. 10. The holding step ST2 is a step of holding the workpiece 200 by the holding table 12, after the removing step ST1 is carried out. In the holding step ST2, the control unit 100 of the cutting apparatus 1 controls the carrying unit to take out one sheet of the workpiece 200 from the cassette 90 and places the workpiece 200 on the holding surface 124 of the holding table 12 positioned in the carrying-in/out region 4. In the holding step ST2, the control unit 100 of the cutting apparatus 1 controls a vacuum suction source, to suction hold the workpiece 200 on the holding surface 124 through the tape 211, as depicted in FIGS. 10 and 11, and suction holds the annular frame 210 on the frame support section 131 through the tape 211, and proceeds to the imaging step ST3.

(Imaging Step)

Figure 12:
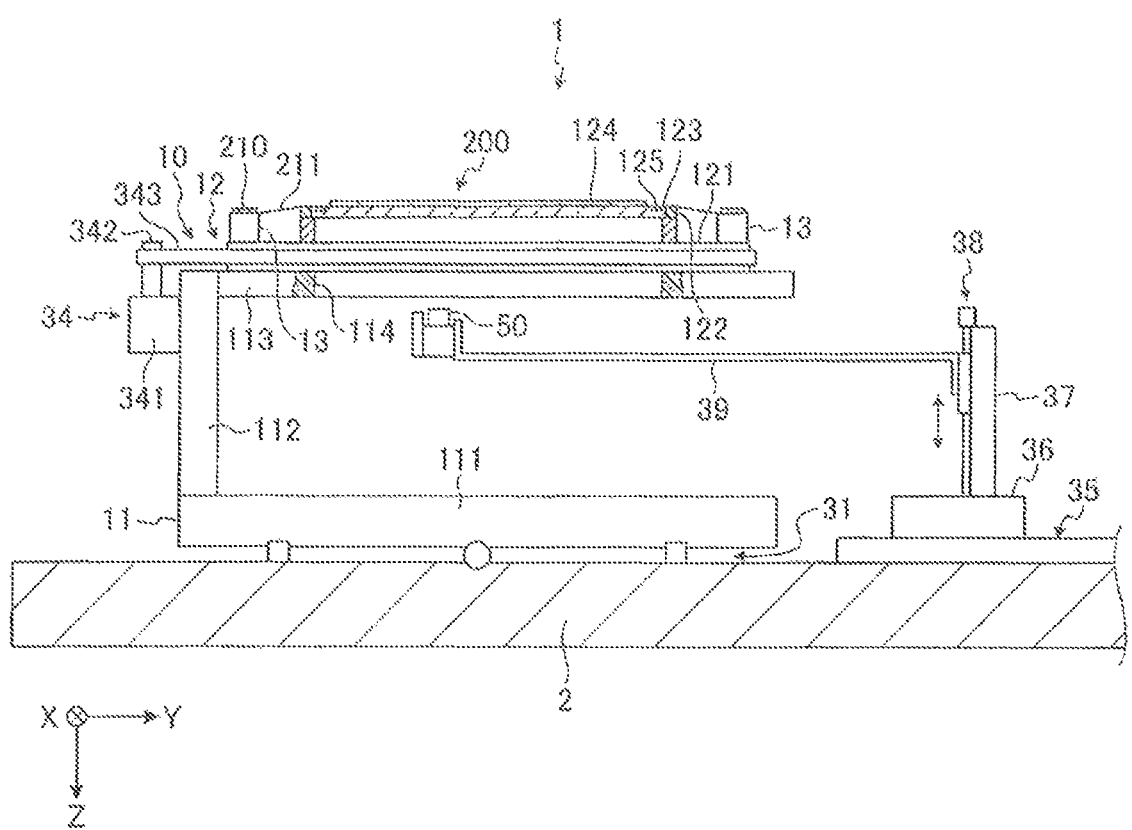
FIG. 12 is a side view depicting, partly in section, an imaging step of the cutting method depicted in FIG. 6.

FIG. 12 is a side view depicting, partly in section, the imaging step of the cutting method depicted in FIG. 6. The imaging step ST3 is a step of imaging the workpiece 200 by the imaging camera 50 through the transparent section 123, after the holding step ST2 is carried out.

In the first embodiment, in the imaging step ST3, the control unit 100 of the cutting apparatus 1 controls the X-axis moving unit 31 and the second Y-axis moving unit 35 to position the imaging camera 50 on a lower side of the holding table 12, as illustrated in FIG. 12. In the imaging step ST3, the control unit 100 of the cutting apparatus 1 images a predetermined part of the workpiece 200 by the imaging camera 50 from below through the transparent section 123, to acquire an image for, for example, performing alignment between the workpiece 200 and the cutting blade 21. In the imaging step ST3, the control unit 100 of the cutting apparatus 1 performs alignment based on the image acquired by the imaging camera 50, and proceeds to the cutting step ST4.

(Cutting Step)

Figure 13:
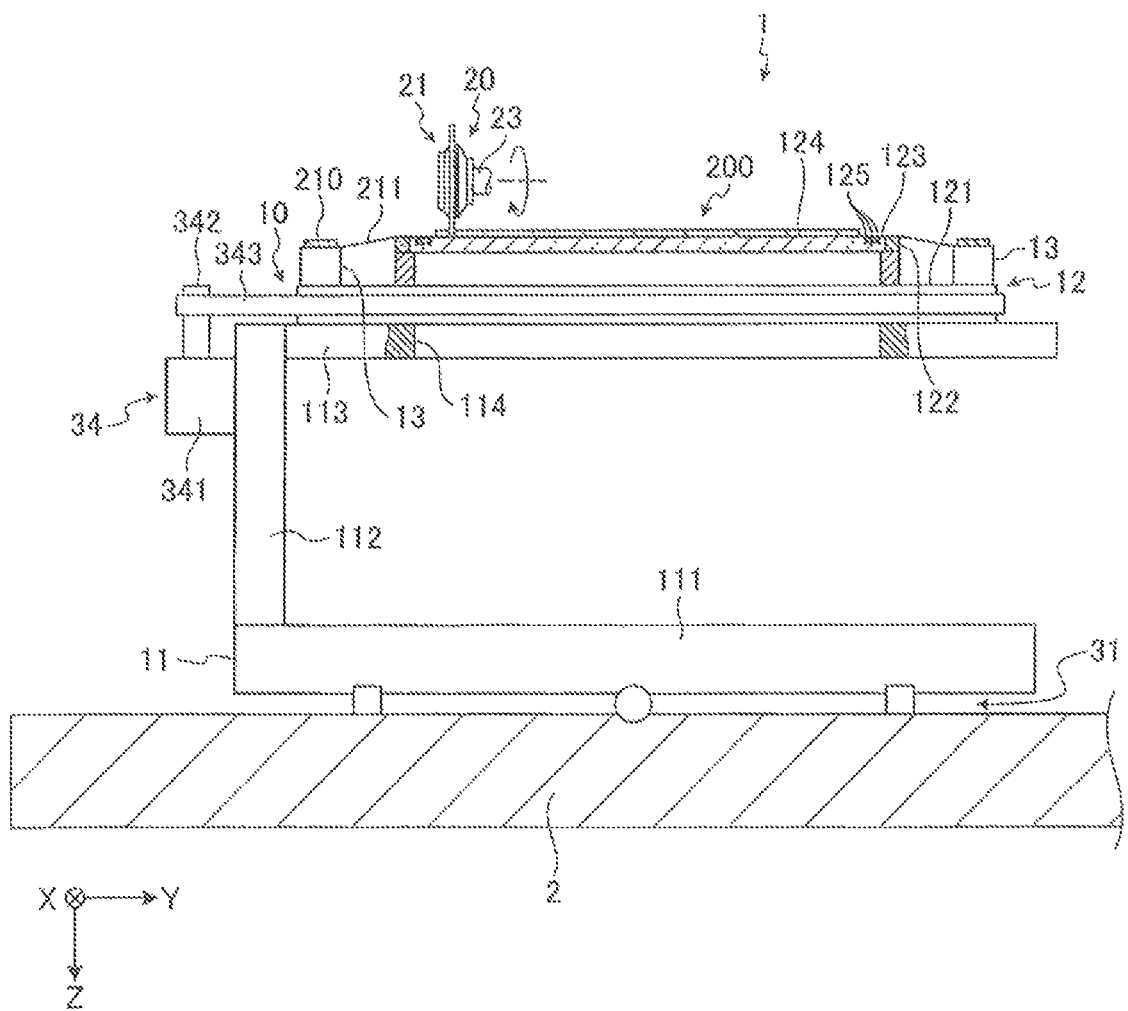
FIG. 13 is a side view depicting, partly in section, a cutting step of the cutting method depicted in FIG. 6.

FIG. 13 is a side view depicting, partly in section, the cutting step of the cutting method depicted in FIG. 6. The cutting step ST4 is a step of cutting the workpiece 200 held on the holding table 12 by the cutting blade 21. In the cutting step ST4, the control unit 100 of the cutting apparatus 1 controls the X-axis moving unit 31 to move the holding table 12 to the processing region 5, and the control unit 100 controls the moving unit 30 and the cutting unit 20 to cause the cutting blade 21 to cut into the streets 203 until reaching the tape 211, while supplying cutting water from the cutting water nozzle 24 while relatively moving the holding table 12 and the cutting blade 21 of the cutting unit 20 along the streets 203, thereby forming cut grooves.

In the cutting step ST4, when the cutting unit 20 cut all the streets 203 of the workpiece 200 held on the holding table 12 to form the cut grooves, the control unit 100 of the cutting apparatus 1 causes the X-axis moving unit 31 to move the holding table 12 to the carrying-in/out region 4, controls the carrying unit to carry the workpiece 200 to the cleaning unit 92, cleans the workpiece 200 by the cleaning unit 92, thereafter accommodates the workpiece 200 in the cassette 90, and finishes the cutting method according to the first embodiment. The cutting apparatus 1 repeats the cutting method depicted in FIG. 6 until all the workpieces 200 in the cassette 90 are cut.

The cutting apparatus 1 according to the first embodiment described above includes the removing unit 60 for removing a liquid adhered to the transparent section 123 of the holding table 12, and therefore, can remove the liquid from the holding table 12 before the workpiece 200 is held. As a result, the cutting apparatus 1 exhibits an effect that the problem of coming out of water drops in an image of the workpiece 200 picked up through the transparent section 123 can be reduced, and the detected state of the workpiece 200 imaged through the transparent section 123 can be restrained from being worsened.

In addition, the removing unit 60 of the cutting apparatus 1 includes the contact member 63 positioned at the contact position and the retracted position, and the X-axis moving unit 31 which is a moving mechanism for relatively moving the contact member 63 on the transparent section 123. Therefore, the contact member 63 making contact with the transparent section 123 at the contact position can be moved on the transparent section 123 by the X-axis moving unit 31, and the liquid can be removed from the transparent section 123.

The cutting method according to the first embodiment is a method of cutting the workpiece 200 by the aforementioned cutting apparatus 1, and the holding step ST2 and the imaging step ST3 are carried out after the removing step ST1 of removing the liquid on the transparent section 123. Therefore, there is obtained an effect that the problem of coming out of water drops in the image of the workpiece 200 picked up through the transparent section 123 can be reduced, and the detected state of the workpiece 200 can be restrained from being worsened.

Second Embodiment

Figure 14:
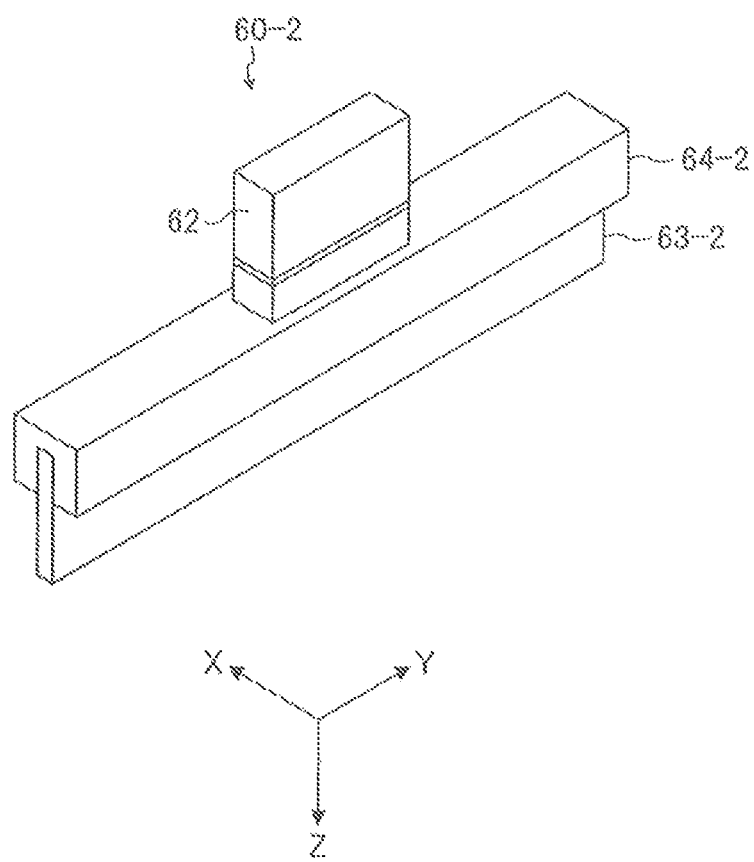

A cutting apparatus according to a second embodiment of the present invention will be described based on the drawings. FIG. 14 is a perspective view depicting a contact member of a removing unit of the cutting apparatus according to the second embodiment, and the like. In FIG. 14, the same parts as those in the first embodiment are denoted by the same reference symbols as used above, and descriptions thereof are omitted.

The cutting apparatus 1 according to the second embodiment is the same as that in the first embodiment, except that a contact member 63-2 of a removing unit 60-2 is a plate-shaped squeegee including a synthetic resin such as a rubber, as depicted in FIG. 14, and a support plate 64-1 supports an upper end portion of the contact member 63-2. The contact member 63-2 according to the second embodiment is formed in a rectangular shape having an overall length longer than the outside diameter of the transparent section 123. The contact member 63-2 is disposed with its longitudinal direction parallel to the Y-axis direction, its one end portion in the width direction is supported by a support plate 64-2, and the other end portion makes contact with the transparent section 123 of the holding table 12, to remove a liquid from the transparent section 123.

The cutting apparatus 1 according to the second embodiment includes the removing unit 60-2 for removing the liquid adhered to the transparent section 123 of the holding table 12, and therefore, the liquid can be removed from the holding table 12 before the workpiece 200 is held. As a result, the cutting apparatus 1 exhibits an effect that the problem of coming out of water drops in an image of the workpiece 200 picked up through the transparent section 123 can be reduced, and the detected state of the workpiece 200 imaged through the transparent section 123 can be restrained from being worsened, like in the first embodiment.

Third Embodiment

Figure 15:
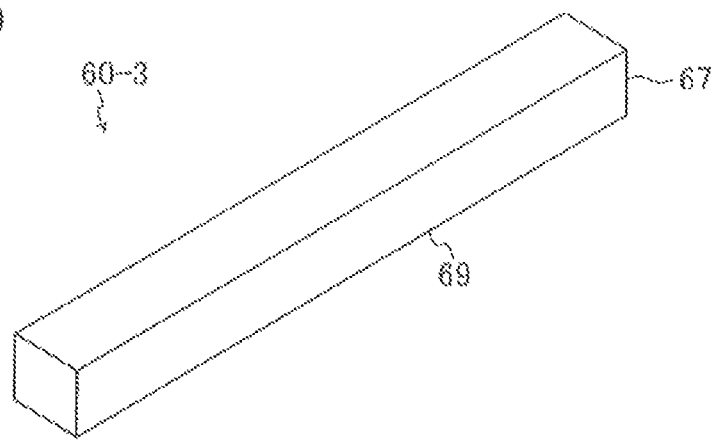
FIG. 15 is a perspective view depicting a jetting section of a removing unit of a cutting apparatus according to a third embodiment.
Figure 15:
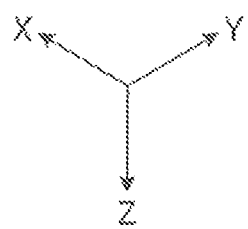
Figure 16:
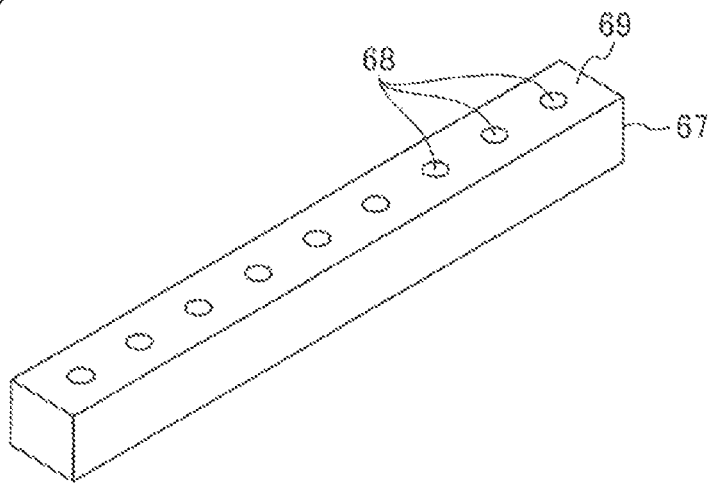
FIG. 16 is a perspective view, as viewed from a lower side, of the jetting section depicted in FIG. 15.
Figure 16:
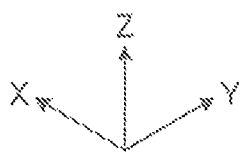

A cutting apparatus according to a third embodiment of the present invention will be described based on the drawings. FIG. 15 is a perspective vide depicting a jetting section of a removing unit of the cutting apparatus according to the third embodiment. FIG. 16 is a perspective view, as viewed from a lower side, of the jetting section depicted in FIG. 15.

The cutting apparatus 1 according to the third embodiment is the same as in the first embodiment, except that a removing unit 60-3 does not include a lifting mechanism 62 but has a jetting section 67 depicted in FIGS. 15 and 16 in place of a contact member 63, and an X-axis moving unit 31 relatively moves the jetting section 67 on a transparent section 123. The jetting section 67 is for jetting pressurized air toward the transparent section 123.

The jetting section 67 of the removing unit 60-3 according to the third embodiment is formed in a tetragonal pyramidal shape in external appearance having an overall length longer than the outside diameter of the transparent section 123. The jetting section 67 is accommodated in a box-shaped section 612 of a unit main body 61 and is disposed in parallel to a Y-axis direction. The jetting section 67 is provided with a plurality of air jetting ports 68 that are supplied with pressurized air from an air supply source (not illustrated) and jet the pressurized air to a lower surface 69 facing a holding table 12, as illustrated in FIG. 16. In the first embodiment, the air jetting ports 68 are arranged at intervals in the longitudinal direction of the jetting section 67.

The cutting apparatus 1 according to the third embodiment includes the removing unit 60-3 for removing a liquid adhered to the transparent section 123 of the holding table 12, and therefore, the liquid can be removed from the holding table 12 before the workpiece 200 is held. As a result, the cutting apparatus 1 exhibits an effect that the problem of coming out of water drops in an image of the workpiece 200 picked up through the transparent section 123 can be reduced, and the detected state of the workpiece 200 imaged through the transparent section 123 can be restrained from being worsened, like in the first embodiment.

In addition, since the cutting apparatus 1 according to the third embodiment has the removing unit 60-3 including the jetting section 67 for jetting pressurized air toward the transparent section 123, the liquid adhered to the transparent section 123 can be removed without putting the removing unit 60-3 into contact with the transparent section 123 of the holding table 12.

Note that the present invention is not limited to the above-described embodiments. In other words, the present invention can be carried out with various modifications within such ranges as not to depart from the gist of the invention. Note that, in the above embodiments, the imaging step ST3 has been carried out for performing alignment. However, the alignment is not limitative of the present invention. For example, the imaging step ST3 may be carried out to image the workpiece 200 by the imaging camera 50 from below through the transparent section 123, also when performing a kerf check of determining deviation of the cut grooves formed in the workpiece 200 from desired positions and determining whether or not the size of chipping generated at both edges of the cut groove, or the like, is within a predetermined range.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cutting apparatus comprising:
   a holding table that has, at at least a part of a holding surface, a transparent section including a transparent member and that holds a workpiece;

a cutting unit including a cutting blade that cuts the workpiece held by the holding table, and a cutting water nozzle that supplies cutting water during cutting of the workpiece by the cutting blade;

an imaging camera, which is disposed below the transparent section, that images the workpiece through the transparent section; and a removing unit that removes a liquid adhered to the transparent section.

2. The cutting apparatus according to claim 1, wherein the removing unit includes:

a contact member that is positioned at a contact position for making contact with the transparent section and a retracted position, and a moving mechanism that relatively moves on the transparent section the contact member making contact with the transparent section.

3. The cutting apparatus according to claim 1, wherein the removing unit includes:

a jetting section that jets air toward the transparent section, and a moving mechanism that moves the jetting section on the transparent section.

4. A cutting method for processing a workpiece by a cutting apparatus, the cutting apparatus including a holding table that has, at at least a part of a holding surface, a transparent section including a transparent member and that holds the workpiece, a cutting unit including a cutting blade that cuts the workpiece held by the holding table, and a cutting water nozzle that supplies cutting water during cutting of the workpiece by the cutting blade, an imaging camera, which is disposed below the transparent section, that images the workpiece through the transparent section, and a removing unit that removes a liquid adhered to the transparent section, the cutting method comprising:

a removing step of removing the liquid on the transparent section by the removing unit;

a holding step of holding the workpiece by the holding table, after the removing step is carried out;

an imaging step of imaging the workpiece by the imaging camera through the transparent section, after the holding step is carried out; and a cutting step of cutting the workpiece held by the holding table by the cutting blade.

5. A cutting apparatus comprising:

a holding table that has, at at least a part of a holding surface, a transparent section including a transparent member and that holds a workpiece;

a cutting unit including a cutting blade that cuts the workpiece held by the holding table, and a cutting water nozzle that supplies cutting water during cutting of the workpiece by the cutting blade;

an imaging camera that images the workpiece through the transparent section; and a removing unit that removes a liquid adhered to the transparent section, wherein the removing unit includes:

a contact member that is positioned at a contact position for making contact with the transparent section and a retracted position, and a moving mechanism that relatively moves on the transparent section the contact member making contact with the transparent section.

6. The cutting apparatus according to claim 1, wherein at least a portion of the removing unit moves relative to the transparent section.

7. The cutting apparatus according to claim 1, wherein the transparent member is one of: quartz glass, borosilicate glass, sapphire, calcium fluoride, lithium fluoride, and magnesium fluoride.

8. The cutting apparatus according to claim 5, wherein the transparent member is one of: quartz glass, borosilicate glass, sapphire, calcium fluoride, lithium fluoride, and magnesium fluoride.

9. The cutting apparatus according to claim 1, wherein the holding surface includes a plurality of suction grooves in the shape of circles different in diameter and disposed concentrically at an outer edge portion of the holding surface.

10. The cutting apparatus according to claim 5, wherein the holding surface includes a plurality of suction grooves in the shape of circles different in diameter and disposed concentrically at an outer edge portion of the holding surface.

11. The cutting apparatus according to claim 2, wherein the removing unit further includes:

a lifting mechanism which lifts the contact member upward and downward in a Z-axis direction.

12. The cutting apparatus according to claim 3, wherein the jetting section includes a plurality of air jetting ports arranged at intervals in the longitudinal direction of the jetting section.

13. The cutting apparatus according to claim 1, wherein the holding table includes a plurality of frame fixing sections which include:

a frame support section; and a vacuum pad that holds an annular frame of the workpiece under suction.

14. The cutting apparatus according to claim 5, wherein the holding table includes a plurality of frame fixing sections which include:

a frame support section; and a vacuum pad that holds an annular frame of the workpiece under suction.

* * * * *